United States Patent
Gu

(10) Patent No.: US 7,099,884 B2
(45) Date of Patent: Aug. 29, 2006

(54) SYSTEM AND METHOD FOR DATA COMPRESSION AND DECOMPRESSION

(75) Inventor: Jinsheng Gu, Alviso, CA (US)

(73) Assignee: InnoPath Software, Sunnyvale, CA (US)

(*) Notice: Subject to any disclaimer, the term of this patent is extended or adjusted under 35 U.S.C. 154(b) by 566 days.

(21) Appl. No.: 10/328,529

(22) Filed: Dec. 24, 2002

(65) Prior Publication Data

US 2004/0111427 A1    Jun. 10, 2004

Related U.S. Application Data

(60) Provisional application No. 60/431,433, filed on Dec. 6, 2002.

(51) Int. Cl.
*G06F 7/00* (2006.01)
*G06F 15/16* (2006.01)
*H04B 1/66* (2006.01)

(52) U.S. Cl. .................. 707/101; 709/247; 375/240

(58) Field of Classification Search .............. 707/101, 707/10; 709/247; 375/240
See application file for complete search history.

(56) References Cited

U.S. PATENT DOCUMENTS

| 5,479,654 | A | | 12/1995 | Squibb ................ 395/600 |
| 5,525,982 | A | * | 6/1996 | Cheng et al. ............ 341/51 |
| 5,574,906 | A | | 11/1996 | Morris |
| 5,608,396 | A | * | 3/1997 | Cheng et al. ............ 341/50 |
| 5,621,403 | A | * | 4/1997 | Reznik ................. 341/51 |
| 5,742,905 | A | | 4/1998 | Pepe .................. 455/461 |
| 5,806,078 | A | | 9/1998 | Hug |
| 5,813,017 | A | | 9/1998 | Morris |
| 5,832,520 | A | | 11/1998 | Miller ................ 707/203 |
| 5,850,565 | A | * | 12/1998 | Wightman .............. 710/1 |
| 6,018,747 | A | | 1/2000 | Burns |
| 6,052,531 | A | | 4/2000 | Waldin |
| 6,088,694 | A | | 7/2000 | Burns ................... 707/8 |
| 6,167,258 | A | | 12/2000 | Schmidt ............... 455/419 |
| 6,226,628 | B1 | * | 5/2001 | Forbes ................. 707/1 |
| 6,233,589 | B1 | | 5/2001 | Balcha |
| 6,269,456 | B1 | | 7/2001 | Hodges |
| 6,320,522 | B1 | * | 11/2001 | Satoh ................. 341/51 |
| 6,327,671 | B1 | | 12/2001 | Menon ................. 714/6 |
| 6,349,311 | B1 | | 2/2002 | Sobel |
| 6,374,250 | B1 | | 4/2002 | Ajtai ................ 707/101 |
| 6,401,239 | B1 | | 6/2002 | Miron |

(Continued)

OTHER PUBLICATIONS

Tichy, Walter F., "The string-to-string correction problem with block moves", ACM Transaction on Computer Systems, vol. 2, No. 4, Nov. 1984, pp. 309-321.

(Continued)

*Primary Examiner*—Safet Metjahic
*Assistant Examiner*—Thanh-Ha Dang
(74) *Attorney, Agent, or Firm*—Courtney Staniford & Gregory LLP

(57) ABSTRACT

A data compressor is provided which performs substitution-based data encoding. The compressor identifies repetitive data of an input file and writes meta-data representative of the repetitive data to a first buffer using a triple structure. The triple structure includes information of a length of non-repetitive data preceding repetitive data, an offset between like groups of repetitive data, and a length of the repetitive data. Non-repetitive data is written to a second buffer. The compressor concatenates the first and second buffers along with information of the length of the input file and the length of the first buffer to form a compressed file. A corresponding decompressor parses the compressed file and quickly computes the original file using a pre-allocated memory area.

29 Claims, 5 Drawing Sheets

U.S. PATENT DOCUMENTS

| | | | |
|---|---|---|---|
| 6,411,227 B1 * | 6/2002 | Fish | 341/65 |
| 6,442,660 B1 | 8/2002 | Henerlau | |
| 6,470,329 B1 | 10/2002 | Livschitz | |
| 6,526,574 B1 | 2/2003 | Jones | |
| 6,535,894 B1 | 3/2003 | Schmidt | |
| 6,542,906 B1 | 4/2003 | Korn | |
| 6,549,148 B1 * | 4/2003 | Satoh | 341/51 |
| 6,594,822 B1 | 7/2003 | Schweitz | |
| 6,615,404 B1 | 9/2003 | Garfunkel | |
| 6,651,190 B1 | 11/2003 | Worley | |
| 6,671,703 B1 | 12/2003 | Thompson | |
| 6,671,757 B1 | 12/2003 | Multer | |
| 6,694,336 B1 | 2/2004 | Multer | 707/201 |
| 6,747,582 B1 * | 6/2004 | Morihara et al. | 341/106 |
| 6,778,103 B1 * | 8/2004 | Satoh | 341/51 |
| 6,836,657 B1 | 12/2004 | Ji | |
| 6,906,644 B1 * | 6/2005 | Satoh | 341/51 |
| 2001/0029178 A1 | 10/2001 | Criss | |
| 2001/0049263 A1 | 12/2001 | Zhang | |
| 2002/0099726 A1 | 7/2002 | Crudele | |
| 2002/0129107 A1 | 9/2002 | Loughran | |
| 2003/0110253 A1 | 6/2003 | Anuszczyk | |
| 2003/0200207 A1 | 10/2003 | Dickinson | |
| 2003/0212712 A1 | 11/2003 | Gu | |
| 2004/0062130 A1 | 4/2004 | Chiang | |
| 2004/0092255 A1 | 5/2004 | Ji | |
| 2004/0096361 A1 | 5/2004 | Peng | |
| 2004/0096413 A1 | 5/2004 | Peng | |
| 2004/0098420 A1 | 5/2004 | Peng | |
| 2004/0098421 A1 | 5/2004 | Peng | |
| 2004/0098427 A1 | 5/2004 | Peng | |
| 2004/0220980 A1 | 11/2004 | Forster | |

OTHER PUBLICATIONS

Ajtai, Miklos et al., "Compactly encoding unstructured inputs with differential compression", IBM Almaden Research Center, 44 pages.

Burns, Randal C. et al., "In-place reconstruction of delta compressed files", IBM Almaden Research Center, 9 pages.

Burns, Randal et al., "In-place reconstruction of version differences", IBM Almaden Research Center, 25 pages.

Liv, Jacob et al., "A universal algorithm for sequential data compression", IEEE Transactions on Information Theory, vol. IT-23, No. 3, May 1977.

J. Ziv and A. Lempel, "A Universal Algorithm for Sequential Data Compression," IEEE Transactions on Information Theory, vol. IT-23, No. 3, May 1977.

* cited by examiner

| Length of non-matchable characters before current match (PRV_NOT_MATCH_LEN) | Offset between matching data strings (CUR_MATCH_OFFSET) | Length of matching data string (CUR_MATCH_LEN) |
|---|---|---|
| 302 | 304 | 306 |

| Input file length (ORIGINAL_FILE_LEN) | Meta buffer length (META_INFO_BUFFER_LEN) | Meta buffer data (META_INFO_BUFFER) | Data buffer data (DATA_BUFFER) |
|---|---|---|---|
| 402 | 404 | 406 | 408 |

SYSTEM AND METHOD FOR DATA COMPRESSION AND DECOMPRESSION

RELATED APPLICATION

This application claims the benefit of U.S. Provisional Application No. 60/431,433, filed Dec. 6, 2002, which is currently pending.

TECHNICAL FIELD

The disclosed embodiments relate to data processing.

BACKGROUND

Data compression is widely used in the processes of transmitting and storing data, especially when transmitting data via a communication channel that is slow, expensive, and/or not reliable. Data compression is a process that reduces the number of bits of information that are used to represent information in a data file or data stream. Data compression is possible because of the existence of certain patterns or strings of information often found in a data file. In particular, certain strings of data may appear in a number of locations within the data file and it is sufficient to identify such repeated strings merely by their position within the file. By taking advantage of such redundancies in the information of a file, it is possible to represent the exact same information using fewer bits of data.

The importance of data compression arises for two primary reasons. First, when data is represented in a compressed form, it requires less bandwidth and less time to transmit this information between different devices, for example between devices in a network, or between different components of a system. Additionally, when storing data, data compression supports storing of the same data file using a smaller amount of memory. Therefore, compressed data is data that may be transmitted faster and stored more efficiently than uncompressed data.

Numerous methods are found in the art for compressing data files. However, these methods generally have shortcomings related to restrictions on the length of match strings that can be encoded and the processing overhead associated with the use of escape characters. Generally, regarding the use of escape characters, existing data compression algorithms use a special character to signal whether the characters that follow the special character are normal data or meta-data; this special character is called the escape character. When compressing files, e.g., binary files, it is not easy to define the escape character. Furthermore, the application of the escape character introduces overhead in the compressed file that impacts the efficiency of the compression.

BRIEF DESCRIPTION OF THE FIGURES

FIG. 3 is a block diagram of a triple structure used to encode meta-data, under the embodiment of FIG. 1.

FIG. 4 is a block diagram of a compressed file structure, under the embodiment of FIG. 1.

Figure 1:
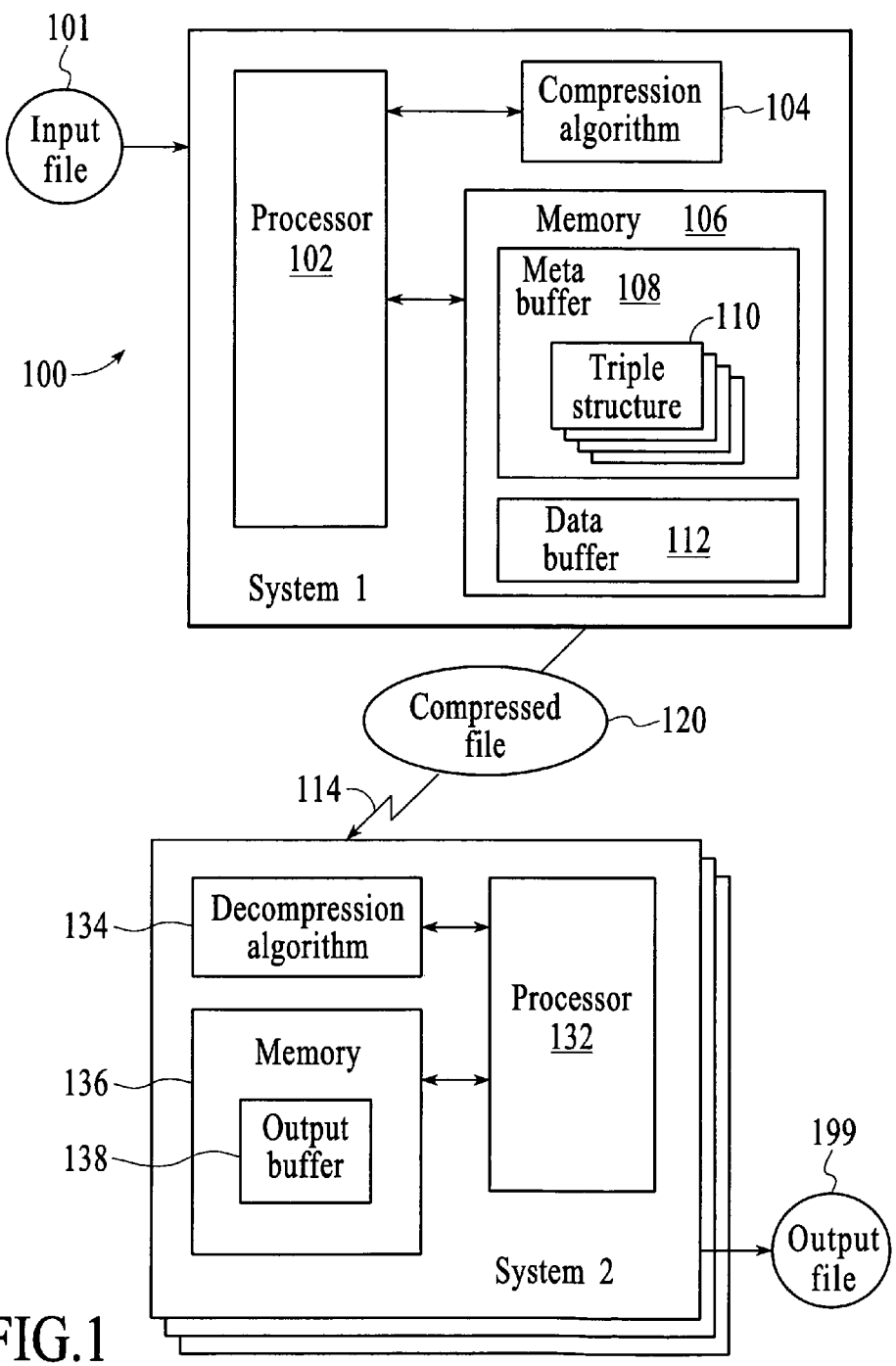
FIG. 1 is a block diagram of a processing system including a data compressor and decompressor, under an embodiment.

In the drawings, the same reference numbers identify identical or substantially similar elements or acts. To easily identify the discussion of any particular element or act, the most significant digit or digits in a reference number refer to the Figure number in which that element is first introduced (e.g., element 104 is first introduced and discussed with respect to FIG. 1).

DETAILED DESCRIPTION

A system and associated methods are provided below for compressing data files using substitution-based data encoding. The system provides compressed data files without the use of escape characters and the associated overhead, and with no restrictions on the length of data match strings. A compressor of the system identifies repetitive data of an input file and writes meta-data representative of the repetitive data to a first buffer using a triple structure. The triple structure includes information of a length of non-repetitive data preceding repetitive data, an offset between like groups of repetitive data, and a length of the repetitive data. Non-repetitive data is written to a second buffer. The compressor concatenates the first and second buffers along with information of the length of the input file and the first buffer to form a compressed file. A decompressor of the system parses the compressed file and quickly computes the original file using a pre-allocated memory area.

In the following description, numerous specific details are introduced to provide a thorough understanding of, and enabling description for, embodiments of the invention. One skilled in the relevant art, however, will recognize that the invention can be practiced without one or more of the specific details, or with other components, systems, etc. In other instances, well-known structures or operations are not shown, or are not described in detail, to avoid obscuring aspects of the invention.

FIG. 1 is a block diagram of a processing system including a data compressor and decompressor, under an embodiment. Generally, the processing system 100 includes a first computer system 1 and one or more second computer systems 2 communicating via a communication path 114. These computer systems 1 and 2 include any collection of processor-based devices or computing devices operating together, or components of processing systems or devices, as is known in the art. For example, the second computer system 2 can be a portable communication device operating in a communication network in which the first computer system 1 is hosted on a network server. In this example, the second computer system 2 can be any of a number and/or combination of devices selected from among personal computers, cellular telephones, personal digital assistants, portable computing devices, and portable communication devices, but is not so limited.

The computer systems 1 and 2 of various alternative embodiments can include components within a larger computer system. Additionally, the components of the first computer system 1 can include one or more of the components of the second computer system 2. In yet another alternative embodiment, the components of the second computer system 2 can include one or more of the components of the first computer system 1.

The communication path 114 includes any medium for communicating or transferring files among the computer systems 1 and 2. Therefore, this path 114 includes wireless connections, wired connections, and hybrid wireless/wired connections. The communication path 114 also includes couplings or connections to networks including local area networks (LANs), metropolitan area networks (MANs), wide area networks (WANs), proprietary networks, interoffice or backend networks, and the Internet. Furthermore, the communication path 114 includes removable fixed mediums like floppy disks, hard disk drives, and CD-ROM disks, as well as flash RAM, Universal Serial Bus (USB) connections, RS-232 connections, telephone lines, buses, and electronic mail messages.

The first computer system 1 includes a processor 102 coupled among a compression algorithm 104 and at least one memory 106. The combination of the processor 102 running under control of the compression algorithm 104 to compress data forms a data compressor or compressor. The memory 106 includes at least two buffers 108 and 112 for use by the compression algorithm 104. The two buffers include a meta buffer (meta_info_buffer) 108 and a data buffer (data_buffer) 112, but are not so limited. The meta buffer 108 stores meta-data in the form of triple structures 110 where the meta-data encodes information of repetitive data of the input file, as described in detail below.

The processor 102, as described in this embodiment, couples among the memory 106 and the compression algorithm 104, under program control. Alternatively, various other components (not shown) of the first computer system 1 can couple among the processor 102, the memory 106, and the compression algorithm 104 and provide input file or data compression under program control. While one processor 102, one memory 106, and one compression algorithm 104 are shown, various alternative embodiments include any number and/or type of each of these components coupled in various configurations or combinations contemplated by one skilled in the art. Further, while the processor 102, memory 106, and compression algorithm 104 are shown as separate blocks, some or all of these blocks can be monolithically integrated onto a single chip, distributed among a number of chips or components of a host system, and/or provided by some combination of algorithms. The compression algorithm 104 can be implemented in software algorithm(s), firmware, hardware, and any combination of software, firmware, and hardware. The term "processor" as generally used herein refers to any logic processing unit, such as one or more central processing units (CPUs), digital signal processors (DSPs), application-specific integrated circuits (ASIC), etc.

In operation, the first computer system 1 receives input files 101 that are to be compressed. The input files 101 include software files including dynamic link library files, shared object files, embedded software components (EBSCs), firmware files, executable files, data files including hex data files, system configuration files, and files including personal use data, but are not so limited. The processor 102 running under control of the compression algorithm 104 identifies repetitive data of the input file and generates a compressed file 120, as described in detail below. A number of methods known in the art can be used to identify repetition of data in the input file. For example, an embodiment uses the adaptive Sliding Window dictionary scheme, which is described in "A Universal Algorithm for Sequential Data Compression," by Jacob Ziv and Abraham Lempel, IEEE Transactions on Information Theory, Vol. IT-23(3): 337–343, May 1997. The compressed file 120 is transferred to the second computer system 2 via the communication path 114.

The compressed file 120, prior to transfer or transmission, can be modified to include checksum values or Cyclic Redundancy Codes (CRCs), etc. for corruption detection. The addition of checksum values or CRCs, etc. supports the detection of errors by the second computer system 2 following transmission of the file. While the embodiments described herein may include the use of verification processes or algorithms that use, for example, checksum values or CRCs, the embodiments may use any verification process or algorithm contemplated by one skilled in the art.

Upon receipt of the compressed file 120, the second computer system 2 operates to decompress the compressed file 120 and generate an output file 199 that is a reconstructed version of the input file. The second computer system 2 includes a processor 132 coupled among a decompression algorithm 134 and at least one memory 136. The combination of the processor 132 running under control of the decompression algorithm 134 to decompress data forms a data decompressor or decompressor. The memory 136 includes at least one buffer in the form of an output buffer 138 for use by the decompression algorithm 134, but is not so limited.

The processor 132 of the second computer system 2, as described in this embodiment, couples among the memory 136 and the decompression algorithm 134, under program control. Alternatively, various other components of the second computer system 2 can couple among the processor 132, the memory 136, and the decompression algorithm 134 and provide file or data decompression under program control. While one processor 132, one memory 136, and one compression algorithm 134 are shown, various alternative embodiments include any number and/or type of each of these components coupled in various configurations or combinations contemplated by one skilled in the art. Further, while the processor 132, memory 136, and compression algorithm 134 are shown as separate blocks, some or all of these blocks can be monolithically integrated onto a single chip, distributed among a number of chips or components of a host system, and/or provided by some combination of algorithms. The decompression algorithm 134 can be implemented in software algorithm(s), firmware, hardware, and any combination of software, firmware, and hardware.

Figure 2:
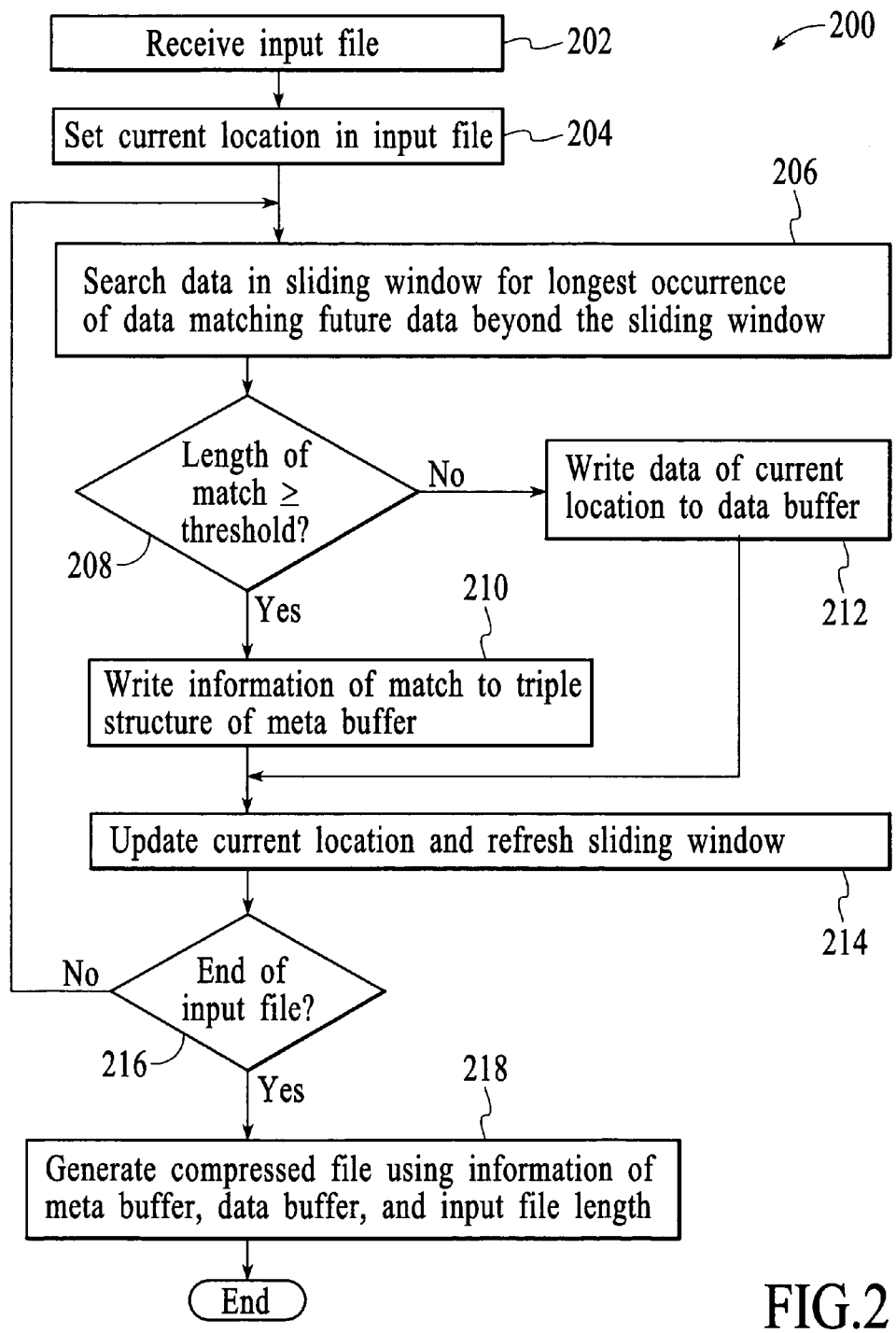
FIG. 2 is a flow diagram of a compression algorithm, under the embodiment of FIG. 1.

The system of an embodiment provides data compression under the control of the compression algorithm 104. FIG. 2 is a flow diagram of a compression algorithm, under the embodiment of FIG. 1. Upon receipt of the input file, at block 202, the compression algorithm sets a Current Location and a Sliding Window in the input file, at block 204. The Current Location is a data location of the input file currently under evaluation, and the Sliding Window includes at most n data locations of the input file which have been evaluated right before the Current Location, where n is referred to as the window size. The compression algorithm, at block 206, searches the data in the Sliding Window for repetitive data patterns or strings. The repetitive data strings include the longest occurrences of data in the Sliding Window that match future data of the input file. Future data is the data found beyond the Current Location. For example, when the input file is

| "a | b c d e 1 2 m | n o p q r 3 4 | a b | c d e 5 6 | m n | o p q r s t", |
|---|---|---|---|---|---|---|
| 0 | 1 2 3 4 5 6 7 | . . . | 15 | . . . | 22 | . . . 29 (location) | and the Current Location is set at location thirteen (13) (counting from the left-most location) and the Sliding Window size is set at a value of five (5), then the five characters "nopqr" are in the Sliding Window and the future data is the string "3 4 a b c d e 5 6 m n o p q r s t".

The compression algorithm determines, at block 208, if the length of the repetitive data strings is at least as large as a threshold value. The threshold value is predetermined as a data string length (number of bytes) at or above which an advantage is gained by compressing the data string. For example, the triple structure of an embodiment to which the meta-data of repetitive data strings is coded consumes three (3) bytes, so compression of the data string provides an advantage for data strings including at least three (3) or more bytes of data.

When the length of the repetitive data strings is at least as large as the prespecified threshold value, at block 208, the compression algorithm writes meta-data representative of the repetitive data strings to triple structures like those of FIG. 3 herein, at block 210. A triple structure is generated for each occurrence of a matching data string, but the embodiment is not so limited. The triple structures are stored in the meta buffer of the memory. Following the writing of meta-data of a matching data string, the compression algorithm updates the Current Location by incrementing the Current Location by an amount equal to the length of the current matching data string, at block 214. Additionally, the compression algorithm refreshes the Sliding Window in accordance with the new position of the Current Location.

When the length of the repetitive data strings is smaller than the prespecified threshold value, at block 208, meaning that no advantage would likely be realized by compressing the data, the compression algorithm writes the data in the Current Location of the input file to the data buffer, at block 212. Following the writing of the Current Location data to the data buffer, the compression algorithm updates the Current Location by incrementing the Current Location by one (1), at block 214. Additionally, the compression algorithm refreshes the Sliding Window in accordance with the new position of the Current Location.

The compression algorithm determines whether the Current Location has reached the end of the input file, at block 216. If the end of the input file has not been reached, operation returns to evaluate the data in the refreshed Sliding Window, at block 206. When the end of the input file has been reached, meaning that all data of the input file has been evaluated, the compression algorithm generates a compressed file using the information of the meta buffer and the data buffer, at block 218, where the compressed file structure is shown in FIG. 4 herein and described fully below.

The following pseudo-code is provided as a high-level description of one example of that used by the compression algorithm. In this example, prv_match_loc references the location of a previous match just preceding a current match, prv_match_len references the length of a previous match just preceding the current match. Further, cur_loc references the Current Location in the compression process, which begins with a count of zero at the first byte of the input file, but is not so limited. The Sliding Window includes the last n characters prior to the Current Location (cur_loc), where the Sliding Window refreshes as the Current Location is incremented. Also, the THRESHOLD references the threshold value at which compression of a data string using meta-data offsets the overhead associated with the compression.

```
set
    prv_match_len = 0;
    prv_match_loc = 0;
    cur_loc = 0;
do
    search through sliding window for longest occurrence of future data
    if the length of match >= THRESHOLD
        write cur_loc – prv_match_loc – prv_match_len,
            current match offset,
            current match length,
            into meta_info_buffer as a set of triple structure;
        prv_match_len = current match length;
        prv_match_loc = cur_loc;
        cur_loc += current match length
    else
        write the character in cur_loc into data_buffer;
        cur_loc += 1;
while bytes available
write the length of the input file into output file;
write the length of meta_info_buffer into output file;
write the content of meta_info_buffer into output file;
write the content of data_buffer into output file.
```

In generating a compressed file, the compressor encodes information of repetitive data using meta-data and writes the meta-data to the meta buffer using a triple structure format. The triple structure supports the encoding of information without the use of an escape key and without the restrictions on the length of match strings that can be encoded. In an embodiment, each triple structure includes meta-data representative of a repetitive string or pattern of data in the input file, but the embodiment is not so limited. FIG. 3 is a block diagram of a triple structure 300 for use in encoding meta-data, under the embodiment of FIG. 1. Each triple structure 300 includes three fields 302–306 for each occurrence of a repetitive data string in the input file. For example, the triple structure 300 includes meta-data representative of the length of non-repetitive or non-matchable characters before a current match (prv_not_match_len) 302, meta-data representative of the offset between like or matching data strings (cur_match_offset) 304, and meta-data representative of the length of repetitive or matching data strings (cur_match_len) 306.

As an example, consider the input file content

| "a | b | c d e 1 2 m n o p q r 3 | 4 a | b c d e 5 6 | m | n o p q r s t". |
|---|---|---|---|---|---|---|
| 0 | 1 | . . . | 15 | . . . | 22 | . . . 29 (location) |

Two repeating data patterns are found: "abcde" and "mnopqr", when the sliding window size is twenty (20). When cur_loc=15, the occurrence of data string "abcde" is found in the Sliding Window with the meta-data as follows:

prv_not_match_len value 302 of fifteen (15) because there is no occurrence of repetitive characters before this current match;
   cur_match_offset value 304 of fifteen (15) because the location of its occurrence in the Sliding Window is zero (0) and the current location is fifteen (15); and
   cur_match_len value 306 of five (5) because there are five characters in the pattern.

Continuing the example, when cur_loc=22, the meta-data representing the occurrence of the data string "mnopqr" is as follows:

prv_not_match_len value 302 of two (2) because there are two non-repetitive characters ("5 6") before this current match and the data string "abcde" starting at location fifteen (15) is the previous repeating data pattern;
   cur_match_offset value 304 of fifteen (15) because the location of its occurrence in the Sliding Window is seven (7) and the current location is twenty-two (22); and
   cur_match_len value 306 of six (6) because there are six characters in the pattern.

Regarding the restrictions found in some prior art compression techniques on the length of match strings that can be encoded, the restrictions arise because the number of bytes used to encode the repetitive data string are limited, typically to three (3) bytes, or 24 bits. Of the 24 bits, one bit might be designated as an escape character, and 16 bits might be typically used to encode the offset information. Therefore, seven (7) bits remain for use in encoding the length of a repetitive data string. Seven bits only support the encoding of a data string of $2^7$ or 128 characters. As such, the length of a repetitive data string that can be encoded is limited to 128 characters. Use of the triple structure of an embodiment eliminates this restriction as shown in the following example.

As an example, consider a data string of 65,536 characters where all of the characters are the letter "a" as follows:

| | | | |
|---|---|---|---|
| "a | a a a a a a | a a a a a . . . a a a a a a a a a a a a a" | |
| 0 | 1 2 3 4 5 6 | . . . | 65,535 (location) |

Using the compression technique and triple structure described above, along with a threshold value of 3 bytes, the compression algorithm encodes the repetitive data starting at location 1 (the second byte). The compressor generates one set of triple structures as follows:

prv_not_match_len value of one (1) because there is one character prior to the current match;
   cur_match_offset value of one (1) because the occurrence of the pattern is one location beyond the start of the input file; and
   cur_match_len value of 65535 because there are 65,535 characters in the pattern.

The resulting triple structure is <1, 1, 65535>. Further, the compressed file size is approximately 10 bytes, as explained below.

FIG. 4 is a block diagram of a compressed file structure 400, under the embodiment of FIG. 1. The compressed file 400 includes four fields 402–408 and is formed from a concatenation of the meta buffer contents and the data buffer contents, along with the length of the original input file and the length of the meta buffer. The compressed file 400 of an embodiment includes the encoded input file length (original_file_len) in a first field 402, the encoded meta buffer length (meta_info_buffer_len) in a second field 404, the encoded meta buffer data or contents (meta_info_buffer) in a third field 406, and the encoded data buffer data or contents (data_buffer) in a fourth field 408. Various alternative embodiments might assemble the compressed file 400 using any number of different orders for the fields 402–408.

Returning to the example above using a data string of 65,536 characters where all of the characters are the letter "a", and the repetitive string is encoded using triple structure <1, 1, 65535>, the compressed file size can be shown to be approximately 10 bytes as follows. The input file length (original_file_len) 402 of 65,536 characters could be coded using three (3) bytes ($2^{16}$=65,536). The meta buffer length (meta_info_buffer_len) 404, which includes the single triple structure, could be coded using one (1) byte. The meta buffer data (meta_info_buffer) 406 could be coded using five (5) bytes (one byte each to encode the prv_not_match_len and cur_match_offset data, and three bytes to encode the value "65535"). The data buffer data (data_buffer) 408 is coded using one (1) byte (one byte for each of the non-repetitive characters preceding the current match). The actual number of bytes of the compressed file depends upon how the integers are encoded; an embodiment uses the variable length integer format as described in detail below, but is not so limited.

Figure 5A:
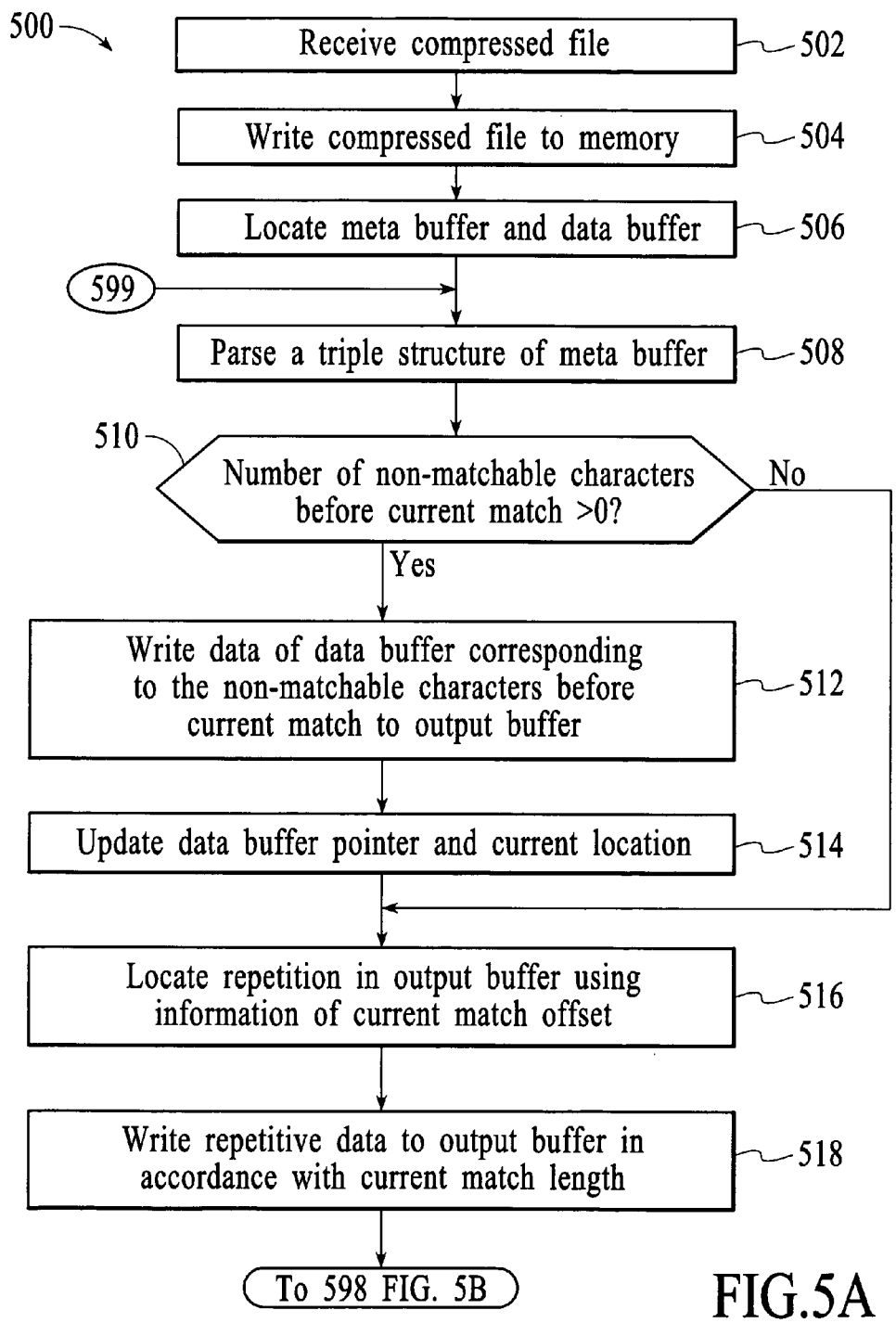
FIGS. 5A and 5B are a flow diagram of a decompression algorithm, under the embodiment of FIG. 1.
Figure 5B:
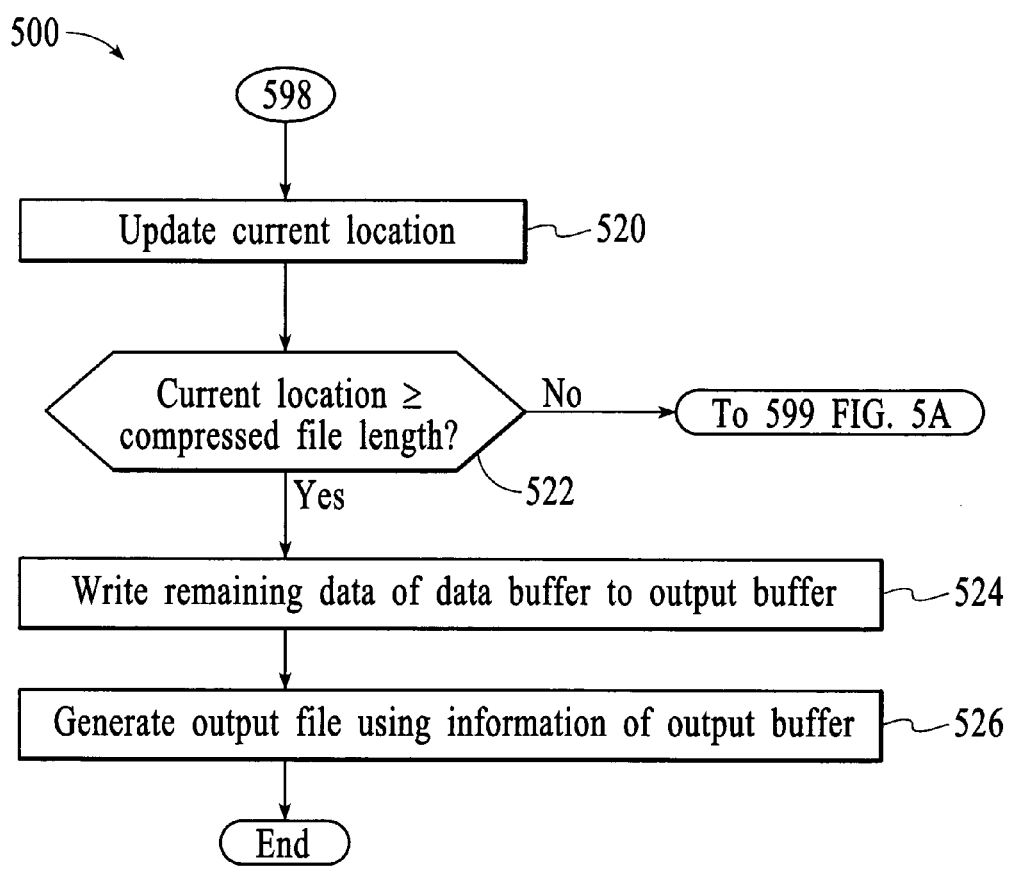

Following generation of the compressed file, components of the system including the compressor can transfer the compressed file to a receiving system or component, as described above. Upon receipt, the receiving system decompresses the compressed file to generate an output file that is a reconstructed version of the input file. FIGS. 5A and 5B are a flow diagram of a decompression algorithm, under the embodiment of FIG. 1. The decompression algorithm of an embodiment uses pre-allocated memory space in the host device so as to accommodate applications in devices with limited memory, but the embodiment is not so limited. In various alternative embodiments, the decompression algorithm can use dynamic memory allocation where permitted by host device memory size.

Upon receipt of the compressed file, at block 502, the decompression algorithm parses the compressed file to extract information of the original input file length and the meta buffer length, and writes the compressed file to memory, at block 504. The decompression algorithm locates the meta buffer data and the data buffer data in the compressed file, at block 506, and allocates an area in an associated memory or memory device for the output buffer.

The decompression algorithm begins decompression by parsing the triple structures of the meta buffer data, at block 508. Using the parsed information, the decompression algorithm reads the length of non-repetitive or non-matchable data preceding the current repetitive data string, or current match, from the triple structure, at block 510. When the length of the non-repetitive data string is determined to be greater than zero, at block 510, the decompression algorithm writes data of the data buffer corresponding to the non-repetitive data preceding the repetitive data string to the output buffer, at block 512, and updates the Current Location and data buffer pointer, at block 514.

The decompression algorithm uses information of the current match offset (cur_match_offset) to identify data locations at which to place repetitive data strings in the output buffer, at block 516. The decompression algorithm then uses the length of the repetitive data string (cur_match_len) to write the repetitive data strings to the identified data locations in the output buffer, at block 518. The decompression algorithm updates the Current Location (cur_loc), at block 520, and uses the updated Current Location value to determine whether the evaluation has reached the end of the compressed file, at block 522. If all triple structures of the compressed file have not been evaluated, operation returns to parse subsequent triple structures of the meta buffer, at block 508.

When the decompression algorithm completes the evaluation of all triple structures of the compressed file, as determined at block 522, any remaining data of the data buffer is written to the output buffer, at block 524. The decompression algorithm finally generates an output file using information of the output buffer, at block 526. The output file is a reconstructed version of the input file.

The following pseudo-code is provided as a high-level description of one example of that used by the decompression algorithm. In this example, prv_match_loc references the location of a previous match just preceding a current match, prv_match_len references the length of a previous match just preceding the current match. Further, cur_loc references the Current Location in the decompression process, which begins with a count of zero at the first byte of the input file, but is not so limited. Also, output_buffer references the output buffer.

```
set
    prv_match_len = 0;
    prv_match_loc = 0;
    cur_loc = 0;
parse the head of compressed file to get
    the length of the original file,
    the length of meta_info_buffer
read compressed file into memory,
locate the meta_info_buffer and data_buffer
allocate memory for output_buffer
do
    parse one set of triple in meta_info_buffer
        to get <prv_not_match_len, cur_match_offset,
        cur_match_len>;
    if prv_not_match_len > 0,
        copy data_buffer of size prv_not_match_len into
        output_buffer;
        update the current data_buffer pointer;
        cur_loc += prv_not_match_len;
    locate the repetition in output_buffer according to
    cur_match_offset;
    copy length of cur_match_len into output_buffer
    prv_match_len = cur_match_len;
    prv_match_loc = cur_loc;
    cur_loc += cur_match_len;
while there is remaining in meta_info_buffer
if(cur_loc < the length of the original file)
    copy remaining of data_buffer into output_buffer;
write output_buffer into output file.
```

Integer values of the compressor and decompressor system of an embodiment are stored using a variable length integer format. A description of the variable length integer format of an embodiment begins with a description of how integer values are stored in a file. The length of the byte stream representing an unsigned integer depends on the integer value. An integer with a value between 0 and 127 can be represented using one byte. If the integer value is between 128 and 16,383, the integer can be represented with two bytes. An integer value between 16,384 and 2,097,151 is represented with three bytes. An integer having a value greater than 2,097,151 requires four or more bytes.

For storage purposes, an integer value of an embodiment is converted into a character string of the form

| C I I I I I I I C I I I I I I I | ... | C I I I I I I | I, |
|---|---|---|---|
| 1 2 3 4 5 6 7 8 1 2 3 4 5 6 7 8 | | 1 2 3 4 5 6 7 | 8 | where "CIIIIIII" represents 8 bits of one byte. The first bit of a byte (the "C" bit) is referred to as a continuous bit. The continuous bit indicates whether more bytes follow the associated byte to be read as part of the current integer. Therefore, if C is a "1" then the following byte should be read as part of the current integer. If C is a "0" the integer ends with the current byte. Thus, this string format representing an unsigned integer is called a variable length integer format.

Generally, the integers used by the compression algorithm provided herein describe offsets, lengths, and other characteristics of the byte stream. Consequently, the integer values used by the system of an embodiment are typically less than 16,383. Use of the variable length integer format provided herein, thus, further reduces the size of the space needed for integer storage in the compressed file.

Aspects of the invention may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the invention include: microcontrollers with memory (such as electronically erasable programmable read only memory (EEPROM)), embedded microprocessors, firmware, software, etc. Furthermore, aspects of the invention may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," and words of similar import, when used in this application, shall refer to this application as a whole and not to any particular portions of this application.

The above description of illustrated embodiments of the invention is not intended to be exhaustive or to limit the invention to the precise form disclosed. While specific embodiments of, and examples for, the invention are described herein for illustrative purposes, various equivalent modifications are possible within the scope of the invention, as those skilled in the relevant art will recognize. The teachings of the invention provided herein can be applied to other processing systems and communication systems, not only for the processing systems described above.

The elements and acts of the various embodiments described above can be combined to provide further embodiments. These and other changes can be made to the invention in light of the above detailed description.

All of the above references and United States patent applications are incorporated herein by reference. Aspects of the invention can be modified, if necessary, to employ the systems, functions and concepts of the various patents and applications described above to provide yet further embodiments of the invention.

In general, in the following claims, the terms used should not be construed to limit the invention to the specific embodiments disclosed in the specification and the claims, but should be construed to include all processing systems that operate under the claims to provide a method for compressing and decompressing data files or streams. Accordingly, the invention is not limited by the disclosure, but instead the scope of the invention is to be determined entirely by the claims.

While certain aspects of the invention are presented below in certain claim forms, the inventors contemplate the various aspects of the invention in any number of claim forms. For example, while only one aspect of the invention is recited as embodied in a computer-readable medium, other aspects may likewise be embodied in a computer-readable medium. Accordingly, the inventors reserve the right to add additional claims after filing the application to pursue such additional claim forms for other aspects of the invention.

What I claim is:

1. A processing system comprising:
   a data compressor coupled to a memory including first and second buffers;
   the data compressor identifying repetitive data strings of an input file and writing meta data representative of each of the repetitive data strings to data structures in the first buffer, wherein the meta data includes information of a length of non-repetitive data preceding the repetitive data strings, an offset between the repetitive data strings, and a length of the repetitive data strings;
   the data compressor writing the non-repetitive data to a second buffer; and
   the data compressor generating a compressed file by concatenating the first buffer and the second buffer, wherein the compressed file is a compressed version of the input file.

2. The processing system of claim 1 wherein the writing of meta data representative of the repetitive data strings by the data compressor comprises:
   setting a current location and a sliding window in the input file, wherein the current location is a data location of the input file currently under evaluation, wherein the sliding window includes at most n data locations of the input file before the current location, wherein n is a size of the sliding window;
   searching data in the sliding window for repetitive data strings, wherein repetitive data strings include longest occurrences of data in the sliding window matching future data beyond the sliding window;
   writing the meta data representative of the repetitive data strings to the data structures in the first buffer when a length of the repetitive data strings is at least as large as a threshold value;
   updating the current location and refreshing the sliding window; and
   searching data in the refreshed sliding window when data remains in the input file.

3. The processing system of claim 1, wherein the writing of non-repetitive data by the data compressor further comprises:
   setting the current location and the sliding window in the input file;
   searching data in the sliding window for the repetitive data strings;
   writing data of the current location to the second buffer when a length of the repetitive data strings is less than the threshold value;
   updating the current location and refreshing the sliding window; and
   searching data in the refreshed sliding window when data remains in the input file.

4. The processing system of claim 1, wherein generating a compressed file further comprises concatenating a length of the input file and the first buffer.

5. The processing system of claim 1, wherein the data compressor is at least one component of a first device.

6. The processing system of claim 1, further comprising a data decompressor coupled to another memory including an output buffer, the data decompressor:
   receiving the compressed file;
   parsing the data structures of the first buffer;
   writing data to the output buffer using information of the data structures of the first buffer and data of the second buffer; and
   generating an output file using information of the output buffer, wherein the output file is a reconstructed version of the input file.

7. The processing system of claim 6, wherein the writing of data to an output buffer by the data decompressor further comprises:
   reading the length of non-repetitive data preceding the repetitive data string from the data structures;
   when the length of non-repetitive data is greater than zero, writing data of the second buffer corresponding to the non-repetitive data preceding the repetitive data string to the output buffer; and
   updating the current location and a data buffer pointer.

8. The processing system of claim 6, wherein the writing of data to an output buffer by the data decompressor further comprises:
   reading the offset between the repetitive data strings from the data structures and identifying data locations in the output buffer for the repetitive data strings;
   reading the length of the repetitive data strings from the data structures;
   writing the repetitive data strings to the identified data locations in the output buffer using the length of the repetitive data strings; and
   updating the current location.

9. The processing system of claim 6, wherein the data decompressor is at least one component of a second device, wherein the second device is coupled to a first device including the data compressor.

10. The processing system of claim 9, wherein the coupling is selected from among wireless connections, wired connections, hybrid wireless and wired connections, and connections with at least one network including local area networks, metropolitan area networks, and wide area networks.

11. The processing system of claim 9, wherein the second device is a portable communication device selected from among personal computers, cellular telephones, personal digital assistants, portable computing devices, and portable communication devices.

12. The processing system of claim 1, wherein the processing system is a component of a communication system.

13. A data compressor coupled to a processor, wherein the data compressor is configured to perform substitution-based data encoding by:
   receiving an input file;
   identifying repetitive data of the input file;
   writing meta-data representative of the repetitive data to a first buffer using a triple structure, wherein the triple structure includes information of a length of non-repetitive data preceding repetitive data, an offset between like groups of repetitive data, and a length of the repetitive data;
   writing non-repetitive data to a second buffer; and
   concatenating the first and second buffers along with information of a length of the input file and a length of the first buffer to form a compressed file.

14. A communication system comprising a first device including a data compressor coupled to a memory including first and second buffers, wherein the data compressor identifies repetitive data strings of an input file and writes meta data representative of each of the repetitive data strings to data structures in the first buffer, wherein the meta data includes information of a length of non-repetitive data preceding the repetitive data strings, an offset between the repetitive data strings, and a length of the repetitive data strings, wherein the data compressor writes the non-repetitive data to a second buffer, and wherein the data compressor generates a compressed file by concatenating the first buffer and the second buffer, wherein the compressed file is a compressed version of the input file.

15. The communication system of claim 14, further comprising a portable communication device coupled to the first device via at least one coupling, the portable communication device including a data decompressor coupled to a device memory including an output buffer, wherein the data decompressor receives the compressed file via the at least one coupling, parses the data structures of the first buffer, writes data to the output buffer using information of the data structures of the first buffer and data of the second buffer, and generates an output file using information of the output buffer, wherein the output file is a reconstructed version of the input file.

16. The communication system of claim 15, wherein the portable communication device is at least one device selected from among cellular telephones, personal digital assistants, portable communication devices, personal computers, and portable computing devices.

17. A method for manipulating data files, comprising:
   receiving an input file and identifying repetitive data strings of the input file;
   writing meta data representative of each of the repetitive data strings to data structures in a first buffer, wherein the meta data includes information of a length of non-repetitive data preceding the repetitive data strings, an offset between the repetitive data strings, and a length of the repetitive data strings;
   writing the non-repetitive data to a second buffer; and
   generating a compressed file by concatenating the first buffer and the second buffer, wherein the compressed file is a compressed version of the input file.

18. The method of claim 17, wherein writing meta data representative of the repetitive data strings further comprises:
   setting a current location and a sliding window in the input file, wherein the current location is a data location of the input file currently under evaluation, wherein the sliding window includes at most n data locations of the input file before the current location, wherein n is a size of the sliding window;
   searching data in the sliding window for repetitive data strings, wherein repetitive data strings include longest occurrences of data in the sliding window matching future data beyond the sliding window;
   writing the meta data representative of the repetitive data strings to the data structures in the first buffer when a length of the repetitive data strings is at least as large as a threshold value;
   updating the current location and refreshing the sliding window; and
   searching data in the refreshed sliding window when data remains in the input file.

19. The method of claim 17, wherein writing non-repetitive data further comprises:
   setting the current location and the sliding window in the input file;
   searching data in the sliding window for the repetitive data strings;
   writing data of the current location to the second buffer when a length of the repetitive data strings is less than the threshold value;
   updating the current location and refreshing the sliding window; and searching data in the refreshed sliding window when data remains in the input file.

20. The method of claim 17, wherein generating a compressed file further comprises concatenating a length of the input file and a length of the first buffer.

21. The method of claim 17, further comprising verifying integration of the generated compressed file.

22. The method of claim 18, wherein data of the sliding window is a compression dictionary.

23. The method of claim 18, wherein the threshold value is approximately three bytes.

24. The method of claim 17, further comprising:
   receiving the compressed file;
   parsing the data structures of the first buffer;
   writing data to an output buffer using information of the data structures of the first buffer and data of the second buffer; and
   generating an output file using information of the output buffer, wherein the output file is a reconstructed version of the input file.

25. The method of claim 24, wherein writing data to an output buffer further comprises:
   reading the length of non-repetitive data preceding the repetitive data string from the data structures;
   when the length of non-repetitive data is greater than zero, writing data of the second buffer corresponding to the non-repetitive data preceding the repetitive data string to the output buffer; and
   updating the current location and a data buffer pointer.

26. The method of claim 24, wherein writing data to an output buffer further comprises:
   reading the offset between the repetitive data strings from the data structures and identifying data locations in the output buffer for the repetitive data strings;

reading the length of the repetitive data strings from the data structures;

writing the repetitive data strings to the identified data locations in the output buffer using the length of the repetitive data strings; and updating the current location.

27. The method of claim 24, further comprising verifying integration of the received compressed file.

28. A method for transferring data files, comprising:

receiving an input file;

identifying repetitive data patterns of the input file;

generating meta data representative of the repetitive data patterns and writing the meta data to a first buffer, wherein the meta data includes information of a length of non-repetitive data preceding the repetitive data strings, an offset between the repetitive data strings, and a length of the repetitive data strings;

writing non-repetitive data to a second buffer; and generating a compressed file by concatenating the first buffer, the second buffer, and information of a length of the input file and a length of the first buffer; and transferring the compressed file.

29. A computer readable medium including executable instructions which, when executed in a processing system, processes data files by:

receiving an input file and identifying repetitive data strings of the input file;

writing meta data representative of each of the repetitive data strings to data structures in a first buffer, wherein the meta data includes information of a length of non-repetitive data preceding the repetitive data strings, an offset between the repetitive data strings, and a length of the repetitive data strings;

writing the non-repetitive data to a second buffer; and generating a compressed file by concatenating the first buffer and the second buffer, wherein the compressed file is a compressed version of the input file.

* * * * *